United States Patent [19]

Suzuki et al.

[11] Patent Number: 5,018,159
[45] Date of Patent: May 21, 1991

[54] DIVIDED ELECTRODE TYPE SEMICONDUCTOR LASER DEVICE

[75] Inventors: Yoshihiro Suzuki; Hiroyoshi Yajima; Junichi Shimada, all of Tsukuba; Kenji Shimoyama; Hideki Gotoh, both of Ushiku, all of Japan

[73] Assignees: Director-General, Agency of Industrial Science and Technology; Mitsubishi Kasei Corporation, both of Tokyo, Japan

[21] Appl. No.: 440,522

[22] Filed: Nov. 22, 1989

[30] Foreign Application Priority Data

Nov. 25, 1988 [JP] Japan ............................ 63-299355

[51] Int. Cl.$^5$ .............................................. H01S 3/19
[52] U.S. Cl. ......................................... 372/46; 372/45
[58] Field of Search ................................... 372/43–46

[56] References Cited

FOREIGN PATENT DOCUMENTS 0235491 11/1985 Japan ..................................... 372/46

Primary Examiner—Georgia Epps
Attorney, Agent, or Firm—Armstrong, Nikaido, Marmelstein, Kubovcik & Murray

[57] ABSTRACT

Disclosed is a divided electrode type semiconductor layer device designed to improve the separation of electrodes without reducing the amount of doping for carrier injection layers. A double-hetero-structure is formed on a semi-insulating substrate, and at least two pairs of carrier injection clad layers are thereafter buried like lands while a high-resistance portion is left between the carrier injection clad layers to electrically separate these layers. The electrodes are respectively formed on the separated carrier injection layers.

4 Claims, 2 Drawing Sheets

DIVIDED ELECTRODE TYPE SEMICONDUCTOR LASER DEVICE

BACKGROUND OF THE INVENTION

This invention relates generally to semiconductor laser devices for producing laser light and, more particularly, to a divided electrode type semiconductor laser device designed to facilitate and improve the separation of the electrodes.

FIG. 2 shows the structure of a lateral junction type buried semiconductor laser device.

This laser device includes a double-hetero-structure which is formed on a semi-insulating substrate 131 and in which a GaAs active layer 137 is interposed between undoped AlGaAs clad layers 133 and 135. For carrier injection, a p-AlGaAs clad layer 139, a p-GaAs cap layer 140, an n-AlGaAs clad layer 141 and an n-GaAs cap layer 142 are formed and buried on the left-hand and right-hand sides of the GaAs active layer 137 respectively as viewed in FIG. 2, and electrodes 143 and 145 are formed on these layers.

In the thus-constructed laser device, a current flowing through the electrodes 143 and 145 is confined between the undoped AlGaAs clad layers 133 and 135 having a high resistance, and carriers are thereby injected into the GaAs active layer 137 having a smaller energy band gap, so that light is generated by recombination of electrons and holes. The generated light is confined between and guided by the upper and lower, left and right clad layers, thereby emitting laser light in the direction perpendicular to the plane of projection of FIG. 2. This laser device is specifically suitable for integration because of the construction in which the device is constructed on the semi-insulating substrate 131, the carrier injection clad layers are positioned on the opposite sides, and the electrodes are independent of the substrate.

FIG. 3 is a top view of the semiconductor laser device shown in FIG. 2. As shown in FIG. 3, leads 147 and 149 are connected to the electrodes 143 and 145, a current is supplied through these leads to inject carriers from the buried carrier injection layers 111 and 113 into the active layer, thereby emitting laser light from opposite ends of the device.

This lateral-junction buried semiconductor laser device may be divided into a plurality of elements which are independently used for oscillation, control and so on to effect pulse oscillation or the like by controlling laser oscillation. For the manufacture of such a tandem electrode type laser, it is necessary to divide each electrode of the semiconductor laser device into a plurality of elements. Conventionally, the electrodes are divided in such a manner that, as shown in FIG. 4, the carrier injection clad layer and the electrodes are partially removed by gas-phase or liquid-phase etching using HCl gas or $H_2O_2$ to form grooves 151 which separate the electrode 143 into electrodes 143a and 143b and the electrode 145 into electrodes 145a and 145b.

However, in a case where a lateral junction type buried semiconductor laser has electrodes divided by etching in this way, the active layer into which electrons and holes are injected from the left and right clad layers has a small thickness of about 0.2 μm and a large width of about 2 μm, and the forward-direction resistance tends to increase. It is therefore necessary to increase the amount of doping for the n-type and p-type clad layers and to form n-type and p-type GaAs cap layers for reducing the resistance of contact with the electrodes. To satisfy these requirements, the facility with which the electrodes are separated as shown in FIG. 4 is sacrificed.

To improve the separation based on etching, it is necessary to etch the outer layers to a depth very close to the active layer. A portion of the active layer may be removed if the extent of etching is excessive, or the electrode cannot be suitably separated if the extent of etching is insufficient. The process of separating the electrodes is thus difficult.

SUMMARY OF THE INVENTION

In view of these problems, an object of the present invention is to provide a semiconductor laser device designed for suitable electrical separation of the electrodes without reducing the amount of doping for the n-type and p-type clad and cap layers and without increasing the forward-direction resistance of the p-n junction.

To achieve this object, according to the present invention, there is provided a lateral junction type buried semiconductor laser device in which carrier injection clad layers are buried like lands while being separated from each other by a high-resistance layer.

DETAILED DESCRIPTION OF THE PREFERRED EMBODIMENT

An embodiment of the present invention will be described below with reference to the accompanying drawings.

Figure 1:
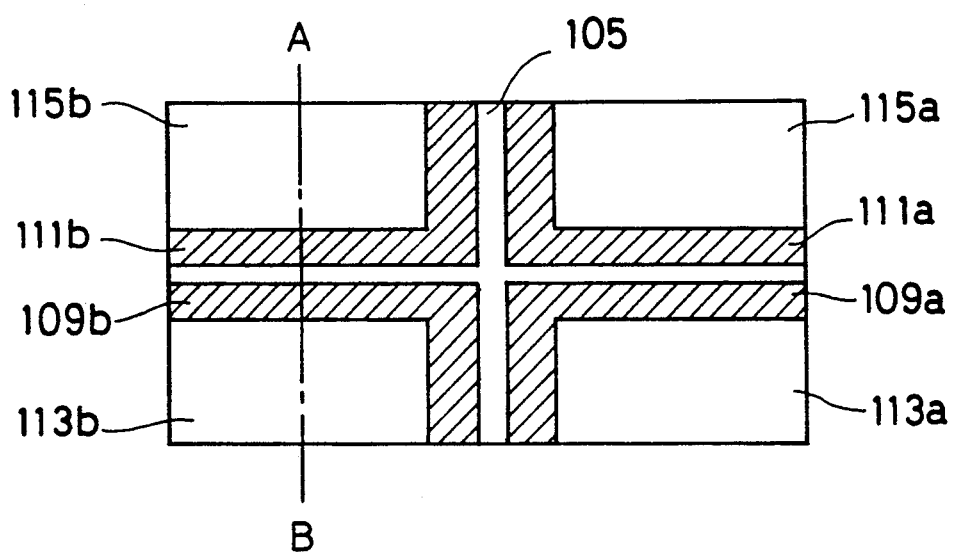
FIG. 1 is a diagram of the structure of a semiconductor laser device in accordance with the present invention.
Figure 2:
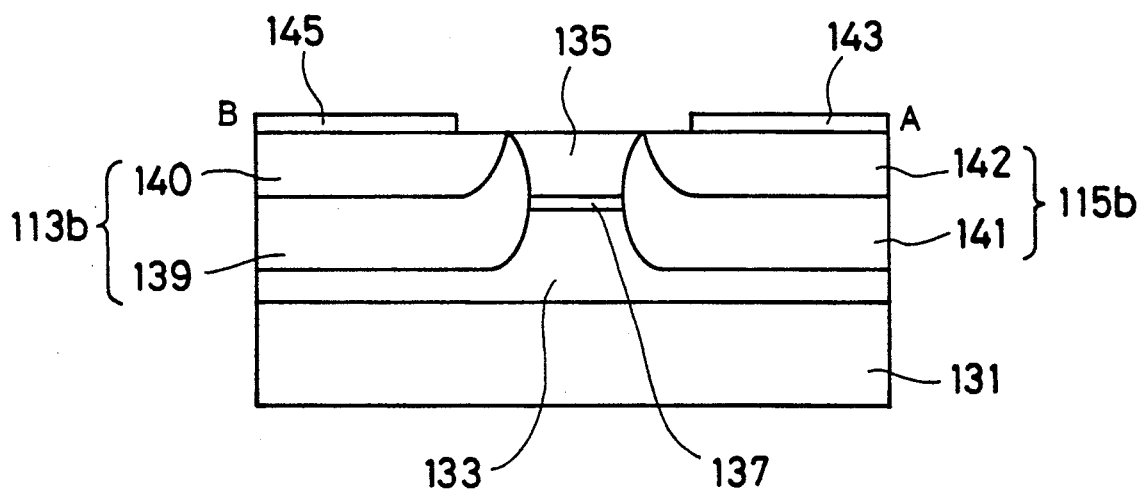
FIG. 2 is a diagram of the structure of a lateral junction type buried semiconductor laser device.
Figure 3:
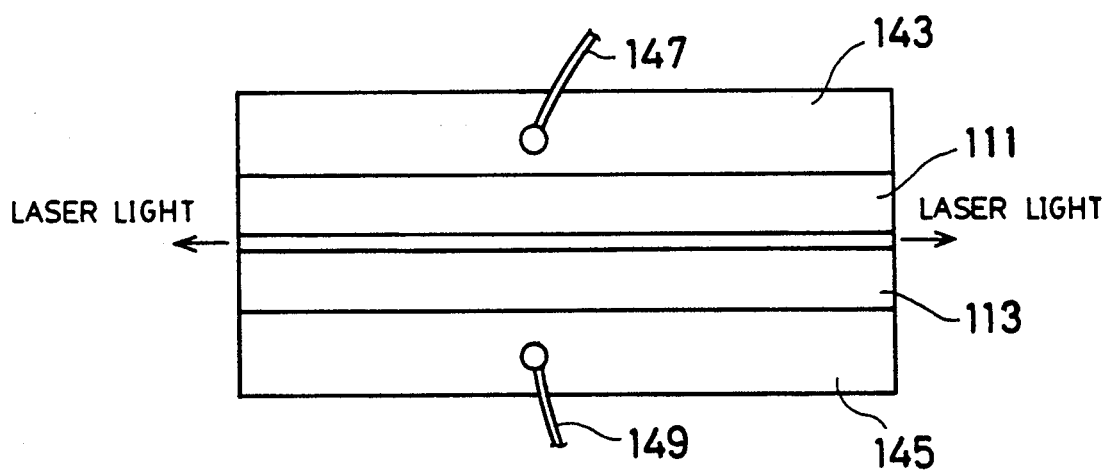
FIG. 3 is a top view of the laser device shown in FIG. 2.
Figure 4:
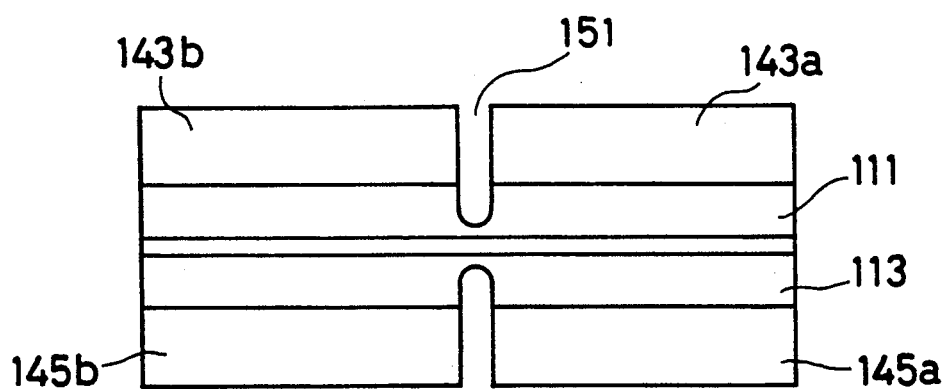
FIG. 4 is a diagram of a state of the laser device of FIG. 3 in which the electrodes are divided by etching.

FIG. 1 is a top view of the structure of a semiconductor laser device in accordance with the present invention, and FIG. 2 is a cross-sectional view taken along the line A - B of FIG. 1. The semiconductor laser device shown in FIGS. 1 and 2 has p-electrodes 113a, 113b; n-electrodes 115a, 115b; a high resistance layer 105 which includes undoped AlGaAs clad layers 133, 135, and a GaAs active layer 137; a p-AlGaAs clad layer 139, p-GaAs cap layer 140, an n-AlGaAs clad layer 141, an n-GaAs cap layer 142, an n-electrode 143 and a p-electrode 145.

As shown in FIG. 2, a double-hetero-structure in which the GaAs active layer 137 is interposed between the undoped AlGaAs clad layers 133 and 135 is formed on the semi-insulating substrate 131, left and right portions of this structure is removed, and the p-AlGaAs clad layer 139, the p-GaAs cap layer 140, the n-AlGaAs clad layer 141 and the n-AlGaAs cap layer 142 are selectively grown as carrier injection clad layers in place of the removed portions. This selective growth of the carrier clad injection layers is effected in such a manner that the carrier injection clad layers 139 and 141 are buried like lands as shown in FIG. 1 so that the high-resistance undoped clad layer remains between the clad layers.

The electrodes 143 and 145 are formed on each of the carrier injection clad layers 139 and 141 thus electrically separated. That is, the buried p-type carrier injection layer 139 is separated into layers 109a and 109b while the buried n-type carrier injection layer 141 is separated into layers 111a and 111b, and p-electrodes 113a and 113b and n-electrodes 115a and 115b are respectively formed on these separated layers. The electrodes are suitably separated electrically since the high-resistance undoped clad layer 135 remains between the electrodes 113a, 113b, 115a and 115b. It is thus possible to improve the electrical separation of the electrodes in a simple manner without reducing the amount of doping for the buried p-type layers 109a and 109b and the buried n-type layers 111a and 111b and, hence, without increasing the forward-direction resistance of the p-n junction.

In the above-described embodiment, the n- and p-clad layers are separated into two elements but, needless to say, it is possible to freely select the number of elements into which these layers are separated.

In accordance with the present invention, as described above, each of the electrodes respectively connected to the p-type and n-type layers can be easily divided without reducing the amount of doping for the buried n-type and p-type carrier injection layers and, hence, without increasing the forward-resistance of the p-n junction.

What is claimed is:

1. A divided electrode type semiconductor laser device, comprising:
    a substrate;
    a pair of carrier injection clad layers;
    cap layers disposed on each one of said pair of carrier injection layers respectively, each of said cap layers having an electrode thereon;
    an active layer disposed between said carrier injection clad layers so as to form a lateral junction type buried semiconductor laser in which said carrier injection clad layers are buried, said active layer comprising a resonant cavity, and
    a high-resistance layer separating said carrier injection clad layers from each other.

2. A laser device according to claim 1, in which said high-resistance layer is an undoped AlGaAs clad layer.

3. A laser device according to claim 1, in which said carrier injection clad layer is a p-type or n-type AlGaAs clad layer.

4. A laser device according to claim 1, in which GaAs cap layers are formed on the carrier injection layer.

* * * * *